(12) United States Patent
Fan et al.

(10) Patent No.: US 11,127,604 B2
(45) Date of Patent: Sep. 21, 2021

(54) MANUFACTURING METHOD OF SEMICONDUCTOR DEVICE (71) Applicant: InnoLux Corporation, Miao-Li County (TW)

(72) Inventors: Chia-Chieh Fan, Miao-Li County (TW); Chin-Lung Ting, Miao-Li County (TW); Cheng-Chi Wang, Miao-Li County (TW); Ming-Tsang Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 188 days.

(21) Appl. No.: 16/211,194

(22) Filed: Dec. 5, 2018

(65) Prior Publication Data
US 2019/0214288 A1  Jul. 11, 2019

Related U.S. Application Data (60) Provisional application No. 62/613,777, filed on Jan. 5, 2018.

(30) Foreign Application Priority Data

Mar. 19, 2018 (CN) .......... 201810223925.0

(51) Int. Cl.
*H01L 21/56* (2006.01)
*H01L 21/48* (2006.01)
(Continued)

(52) U.S. Cl.
CPC ........ *H01L 21/568* (2013.01); *H01L 21/4853* (2013.01); *H01L 21/561* (2013.01); *H01L 21/565* (2013.01); *H01L 21/6835* (2013.01); *H01L 24/97* (2013.01); *H01L 25/50* (2013.01); *H01L 23/3128* (2013.01); *H01L 25/105* (2013.01); *H01L 2221/68345* (2013.01); *H01L 2221/68359* (2013.01);
(Continued)

(58) Field of Classification Search
CPC . H01L 21/6835; H01L 21/568; H01L 21/561; H01L 25/50; H01L 25/105; H01L 23/3128; H01L 24/97; H01L 2224/04105; H01L 2224/12105
See application file for complete search history.

(56) References Cited

U.S. PATENT DOCUMENTS 9,543,224 B1 * 1/2017 Meyer ................ H01L 21/4853
9,905,515 B2 * 2/2018 Chang ............... H01L 23/49838
(Continued)

FOREIGN PATENT DOCUMENTS

CN       105355569 A    2/2016
CN       107301956 A   10/2017

*Primary Examiner* — Errol V Fernandes
*Assistant Examiner* — Jeremy J Joy
(74) *Attorney, Agent, or Firm* — Winston Hsu (57) ABSTRACT

A manufacturing method of semiconductor device includes providing a substrate, forming a sacrificial layer on the substrate, disposing first chips on the sacrificial layer, forming a first dielectric layer surrounding the first chips, forming trenches in the first dielectric layer, and forming a second dielectric layer in the trenches, wherein an upper surface of the first dielectric layer and an upper surface of the second dielectric layer are at a same plane.

9 Claims, 11 Drawing Sheets

(51) Int. Cl.
H01L 25/00 (2006.01)
H01L 21/683 (2006.01)
H01L 23/00 (2006.01)
*H01L 23/31* (2006.01)
*H01L 25/10* (2006.01)

(52) U.S. Cl.
CPC ............. *H01L 2224/0231* (2013.01); *H01L 2224/0233* (2013.01); *H01L 2224/12105* (2013.01); *H01L 2224/95001* (2013.01); *H01L 2225/1023* (2013.01); *H01L 2225/1058* (2013.01); *H01L 2225/1094* (2013.01); *H01L 2924/18162* (2013.01); *H01L 2924/3511* (2013.01)

(56) References Cited

U.S. PATENT DOCUMENTS

| | | | |
|---|---|---|---|
| 10,347,509 B1* | 7/2019 | Shen | H01L 21/565 |
| 2004/0222509 A1* | 11/2004 | Ogata | H01L 24/33 257/686 |
| 2005/0224959 A1* | 10/2005 | Kwon | H01L 24/32 257/723 |
| 2005/0258527 A1* | 11/2005 | Lee | H01L 25/0657 257/685 |
| 2006/0035408 A1* | 2/2006 | Derderian | H01L 25/50 438/106 |
| 2007/0013060 A1* | 1/2007 | Kwon | H01L 24/32 257/725 |
| 2008/0182363 A1* | 7/2008 | Amrine | H01L 21/568 438/118 |
| 2009/0108440 A1* | 4/2009 | Meyer | H01L 24/96 257/723 |
| 2011/0119910 A1* | 5/2011 | Xu | H01L 23/5389 29/832 |
| 2012/0001325 A1* | 1/2012 | Lin | H01L 23/552 257/737 |
| 2013/0015589 A1* | 1/2013 | Liao | H01L 25/0657 |
| 2014/0217597 A1* | 8/2014 | Lin | H01L 24/97 257/773 |
| 2015/0014856 A1 | 1/2015 | Mohammed | |
| 2015/0348861 A1* | 12/2015 | Chia | H01L 21/486 257/774 |
| 2015/0380275 A1* | 12/2015 | Wang | H01L 21/6836 438/113 |
| 2016/0351509 A1* | 12/2016 | Dang | H01L 25/0655 |
| 2016/0379935 A1* | 12/2016 | Shih | H01L 23/49827 257/738 |
| 2017/0098633 A1* | 4/2017 | Kumar | H01L 23/3114 |
| 2018/0061672 A1 | 3/2018 | Chang | |
| 2018/0113975 A1* | 4/2018 | Sherazi | H01L 27/0207 |
| 2019/0252278 A1* | 8/2019 | Shen | H01L 23/5385 |

\* cited by examiner

MANUFACTURING METHOD OF SEMICONDUCTOR DEVICE

CROSS REFERENCE TO RELATED APPLICATION

This patent application claims the benefit of U.S. provisional application No. 62/613,777, filed Jan. 5, 2018, and the entire contents of which are incorporated herein by reference.

BACKGROUND OF THE DISCLOSURE

1. Field of the Disclosure

The present disclosure relates to a manufacturing method of a semiconductor device, and more particularly to a packaging manufacturing method of a semiconductor device.

2. Description of the Prior Art

With the development of technology, electronic products have become essential products in daily life, wherein semiconductor devices are one of the key devices in the electronic products. In general, semiconductor devices have to go through packaging processes to be applied to various kinds of electronic products, such as mobile phones, computers, digital cameras, wearable devices and so on. However, packaging structures of conventional semiconductor devices have inner stress issues of the packaging materials such that warpage may occur easily in the packaging structures. Therefore, conventional packaging methods for electric devices still need further improvement.

SUMMARY OF THE DISCLOSURE

The present disclosure provides a manufacturing method of semiconductor device which includes providing a substrate; forming a sacrificial layer on the substrate; disposing a plurality of first chips on the sacrificial layer; forming a first dielectric layer surrounding the plurality of first chips; forming a plurality of trenches in the first dielectric layer; and forming a second dielectric layer in the trenches, wherein an upper surface of the first dielectric layer and an upper surface of the second dielectric layer are at a same plane.

The present disclosure further provides a manufacturing method of semiconductor device which includes providing a substrate; forming a sacrificial layer on the substrate; forming a resin layer on the sacrificial layer; disposing a plurality of first chips on the sacrificial layer; and forming a first dielectric layer having a plurality of trenches and surrounding the plurality of first chips, wherein an upper surface of the first dielectric layer and an upper surface of the resin layer are at a same plane.

The present disclosure further provides a manufacturing method of semiconductor device which includes providing a substrate; forming a sacrificial layer on the substrate; disposing a plurality of first chips on the sacrificial layer; forming a first dielectric layer having a plurality of trenches and surrounding the plurality of first chips; and forming a second dielectric layer in at least one trench of the plurality of trenches, wherein an upper surface of the first dielectric layer and an upper surface of the second dielectric layer are at a same plane.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that the drawings are simplified schematic diagrams, and therefore, the drawings show only the components and combinations associated with the present disclosure, so as to provide a clearer description of the basic architecture or method of implementation of the present disclosure. The components would be more complex in reality. In addition, for explanation, the components shown in the drawings of the present disclosure may not be drawn to scale of the actual number, shape, and dimensions, and the detail and scale can be adjusted according to the design requirements.

Furthermore, when the terms "include", "comprise" and/or "have" are used in the description of the present disclosure, the corresponding features, areas, steps, operations and/or components would be pointed to existence, but not limited to the existence or addition of one or more other features, areas, steps, operations and/or components. When a component (or the variant thereof such as layer of area) is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", there are no intervening components presented therebetween. In addition, when a component is referred to "be coupled to" another component (or the variant thereof), it may be directly connected to the another component, or may be indirectly connected (such as electrically connected) to the another component through other component or components.

It should be noted that the different embodiments described in the following can be replaced, recombined, or mixed with one another to constitute other embodiments without departing from the spirit of the present disclosure.

Figure 1:
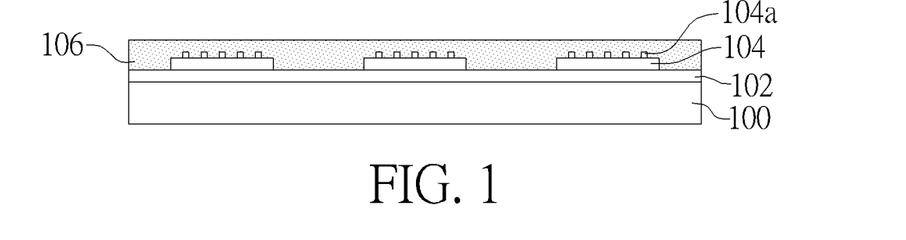
FIG. 1 to FIG. 5 are schematic diagrams illustrating fabrication process of a manufacturing method of semiconductor device according to a first embodiment of the present disclosure.

Referring to FIG. 1 to FIG. 5, FIG. 1 to FIG. 5 are schematic diagrams illustrating fabrication process of a manufacturing method of semiconductor device according to a first embodiment of the present disclosure. The manufacturing method of semiconductor device of the present disclosure is introduced in the following. As shown in FIG. 1, a substrate 100 is first provided, then a sacrificial layer 102 is formed on the substrate 100, wherein the substrate 100 may be a transparent rigid substrate (such as glass, but not limited thereto) for instance or may be other substrate that may serve as a carrier board (such as a flexible carrier board, but not limited thereto). And then, a plurality of first chips 104 are formed on the sacrificial layer 102, wherein a surface of the first chip 104 may include a plurality of bonding pads 104a disposed on a side of the first chip 104 opposite to the sacrificial layer 102. After disposing the first chips 104, a first dielectric layer 106 is formed on the sacrificial layer 102, wherein the first dielectric layer 106 surrounds the first chips 104 and may cover an upper surface of the first chips 104. The first dielectric layer 106 may be any usual packaging material, such as (but not limited to) epoxy.

Figure 2:
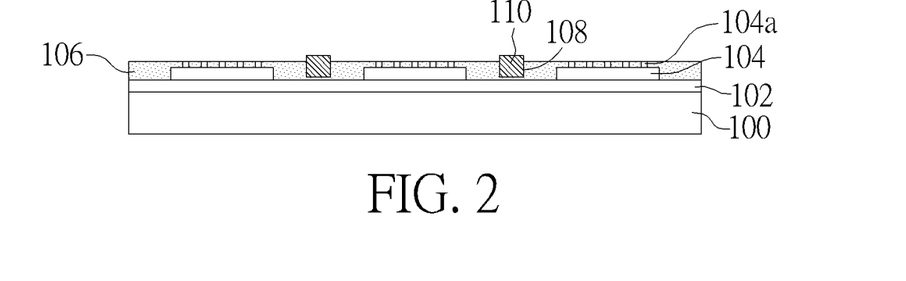

Referring to FIG. 2, next, a portion of the first dielectric layer 106 is removed. For example, a grinding process can be performed (but not limited thereto) to flatten an upper surface 106a of the first dielectric layer 106 and substantially make the upper surface 106a of the first dielectric layer 106 and the upper surface of the bonding pads 104a of the first chips 104 at a same plane to expose the bonding pads 104a of the first chips 104. In the present disclosure, the meaning of "at a same plane" means that a distance from an upper surface of the bonding pads 104a of the first chips 104 to a reference surface parallel to the upper surface of the bonding pads 104 is substantially (or nominally) equal to a distance from the upper surface 106a of the first dielectric layer 106 to the reference surface parallel to the upper surface of the bonding pads 104. Then, a plurality of trenches 108 are formed in the first dielectric layer 106. For example, the trenches 108 may be disposed between adjacent first chips 104, but not limited thereto. The trenches 108 in this embodiment do not penetrate through the first dielectric layer 106. In other embodiments, the trenches 108 may have different depths as needed, which may for example penetrate through the first dielectric layer 106. The depths of the trenches 108 will be introduced hereinafter. For example, the forming method of the trenches 108 may include wheel cutting, plasma cutting or laser cutting, but not limited thereto. After the trenches 108 are formed, a second dielectric layer 110 is formed in the trenches 108. For example, the trenches 108 can be filled with the second dielectric layer 110 by glue dispensing process, spraying process, printing process and so on, but the forming method of the second dielectric layer 110 is not limited thereto. The second dielectric layer 110 may be any common dielectric material or packaging material, and the material of the second dielectric layer 110 may be the same as or different from the material of the first dielectric layer 106. For example, in this embodiment, the material selected for the second dielectric layer 110 has a different coefficient of thermal expansion (CTE) from the first dielectric layer 106. The material of the second dielectric layer 110 may be polyimide (PI) as an example, or may include underfill material, glue or other suitable materials, and the material of the second dielectric layer 110 in the present disclosure is not limited thereto.

Figure 3:
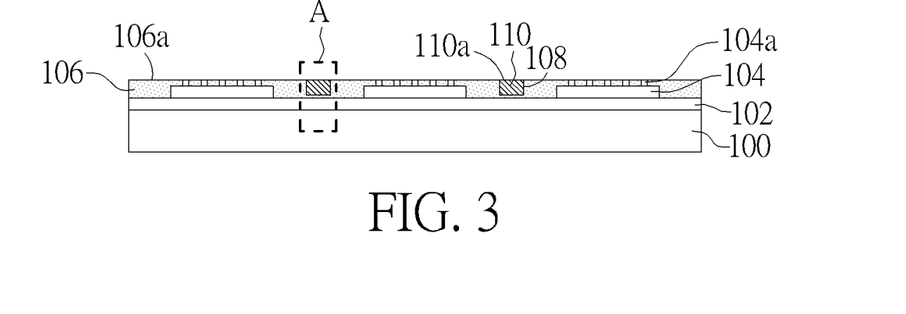
Figure 4:
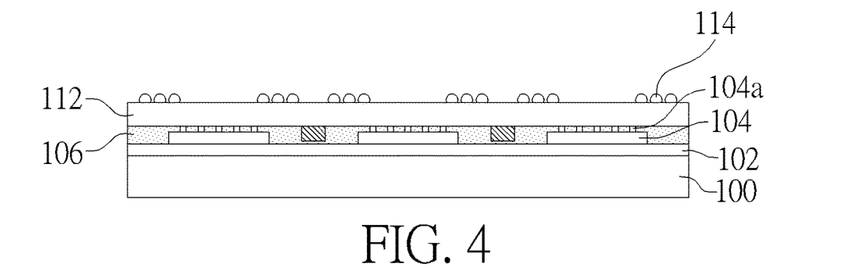

Referring to FIG. 3, next, a portion of the second dielectric layer 110 higher than the upper surface 106a of the first dielectric layer 106 is removed, such that the upper surface 106a of the first dielectric layer 106 and an upper surface 110a of the second dielectric layer 110 are substantially at the same plane, that is, a distance from the upper surface 106a of the first dielectric layer 106 to a reference surface parallel to the upper surface 106a of the first dielectric layer 106 is substantially equal to a distance from the upper surface 110a of the second dielectric layer 110 to the reference surface parallel to the upper surface 106a of the first dielectric layer 106. For example, the method of removing the portion of the second dielectric layer 110 may include performing a grinding process, but not limited thereto. Referring to FIG. 4, a redistribution layer (RDL) 112 is formed on the first dielectric layer 106 and the second dielectric layer 110, wherein the conducting wires of the redistribution layer 112 are electrically connected to the first chips 104 through the bonding pads 104a. In addition, a plurality of solder balls 114 may be selectively formed on the redistribution layer 112 according to the manufacturing method of the present disclosure, wherein each of the solder balls 114 can be electrically connected to one of the first chips 104. For example, the solder ball 114 may be electrically connected to the circuit in the first chip 104 through the redistribution layer 112 and the corresponding bonding pad(s) 104a of the first chip 104. However, in some embodiments, the electrical connection can be designed that one or more solder balls 114 may not be electrically connected to the first chips 104.

Figure 5:
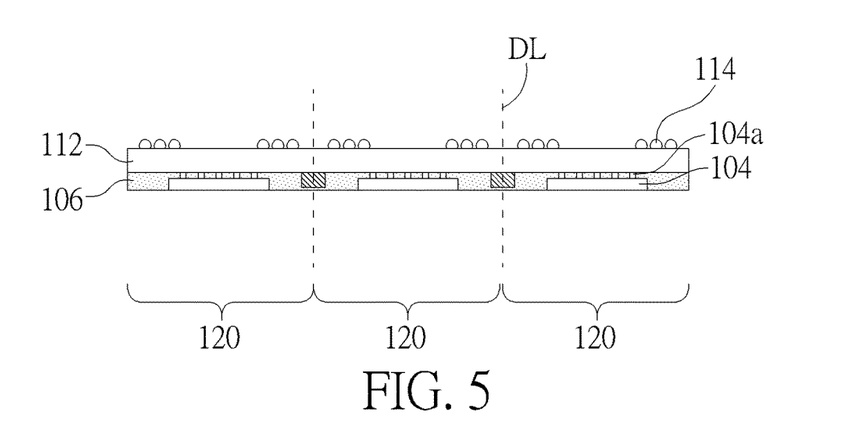

Next, referring to FIG. 5, a detaching process (or called as lift-off process) is performed to detach the first chips 104 from the sacrificial layer 102 and the substrate 100. After that, a cutting process is performed to separate the first chips 104 from each other along the cutting lines DL, thus packaging structures 120 of semiconductor device with a first chip 104 are manufactured. The second dielectric layer 110 may remain or not remain in the packaging structures 120 after the cutting process. Because the bonding pads 104a of the first chip 104 are disposed at a side of the first chip 104 opposite to the sacrificial layer 102, the packaging structure 120 may be considered as a face-up type of packaging structure.

Figure 6:
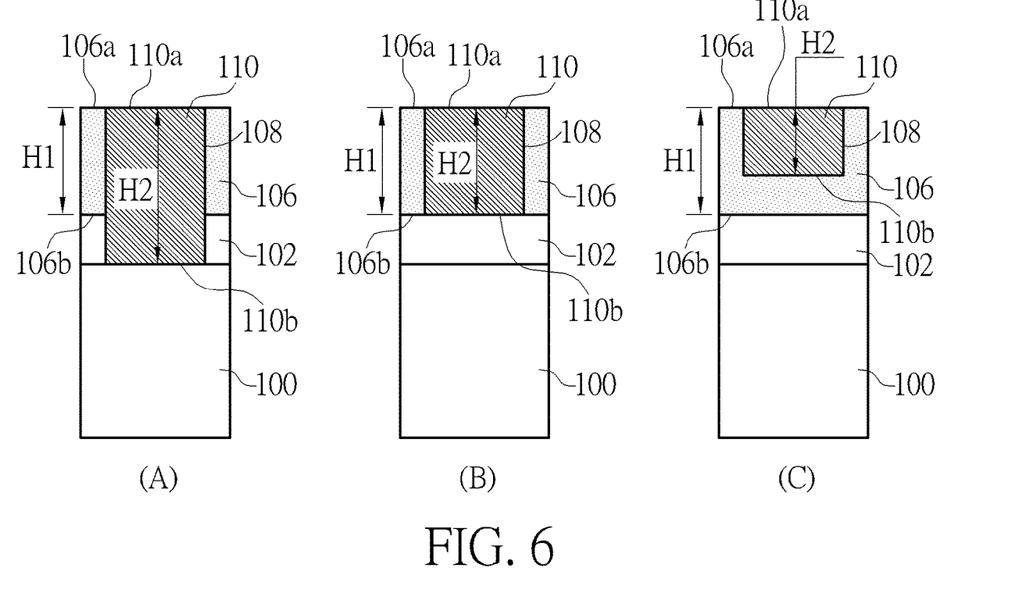
FIG. 6 is a partial-enlargement schematic diagram of a first dielectric layer and a second dielectric layer according to a variant embodiment of the present embodiment.

As aforementioned, the trenches 108 of the first embodiment do not penetrate through the first dielectric layer 106, and therefore the thickness of the second dielectric layer 110 filling the trenches 108 is less than the thickness of the first dielectric layer 106. However, in variant embodiments, the trenches 108 may have a various depths. Referring to FIG. 6, FIG. 6 is a partial-enlargement schematic diagram of the first dielectric layer 106, the second dielectric layer 110, the sacrificial layer 102 and the substrate 100 that corresponds to the region A shown in FIG. 3, in which relative thicknesses of the first dielectric layer 106 and the second dielectric layer 110 invariant embodiments are illustrated. As shown in FIG. 6, the first dielectric layer 106 has a first thickness H1, an upper surface 106a and a lower surface 106b, wherein the upper surface 106a and the lower surface 106b correspond to each other, and the first thickness H1 is defined as a distance between the upper surface 106a and the lower surface 106b. The second dielectric layer 110 has a second thickness H2, an upper surface 110a and a lower surface 110b, wherein the second thickness H2 is defined as a distance between the upper surface 110a and the lower surface 110b. As shown in part (A) of FIG. 6, the trench 108 may penetrate through the first dielectric layer 106 and extend downward, even penetrating through the sacrificial layer 102 and reaching an upper surface of the substrate 100, and therefore the first thickness H1 of the first dielectric layer 110a is less than the second thickness H2 of the second dielectric layer 110 in the trench 108. As shown in part (B) of FIG. 6, the trench 108 only penetrates through the first dielectric layer 106 and does not extend to the sacrificial layer 102, and therefore the first thickness H1 of the first dielectric layer 106 is substantially equal to the second thickness H2 of the second dielectric layer 110. As shown in part (C) of FIG. 6, the trench 108 does not penetrate through the first dielectric layer 106. For example, the depth of the trench 108 is, but not limited to, a half of the first thickness H1, and therefore the first thickness H1 of the first dielectric layer 106 is greater than the second thickness H2 of the second dielectric layer 110, and a ratio (H2/H1) of the second thickness H2 to the first thickness H1 is 0.5. As described above, different designs may be applied according to the requirement when forming the trenches 108 in the present disclosure, such that the first dielectric layer 106 and the second dielectric layer 110 may have different relative thicknesses. According to the present disclosure, the ratio (H2/H1) of the second thickness H2 to the first thickness H1 ranges from 0.5 to 1.5. That is, the first dielectric layer 106 may be continuous or a discontinuous in the present disclosure.

According to the present disclosure, the stress distribution of the dielectric material in the packaging structure 120 can be adjusted through forming the trenches 108 in the first dielectric layer 106 and forming the second dielectric layer 110 in the trenches 108. For example, the disposition of the trenches 108 and the second dielectric layer 110 can make the stress in the dielectric layer discontinuous, such that warpage of the packaging structure 120, due to high-temperature process for example, may be reduced.

Figure 22:
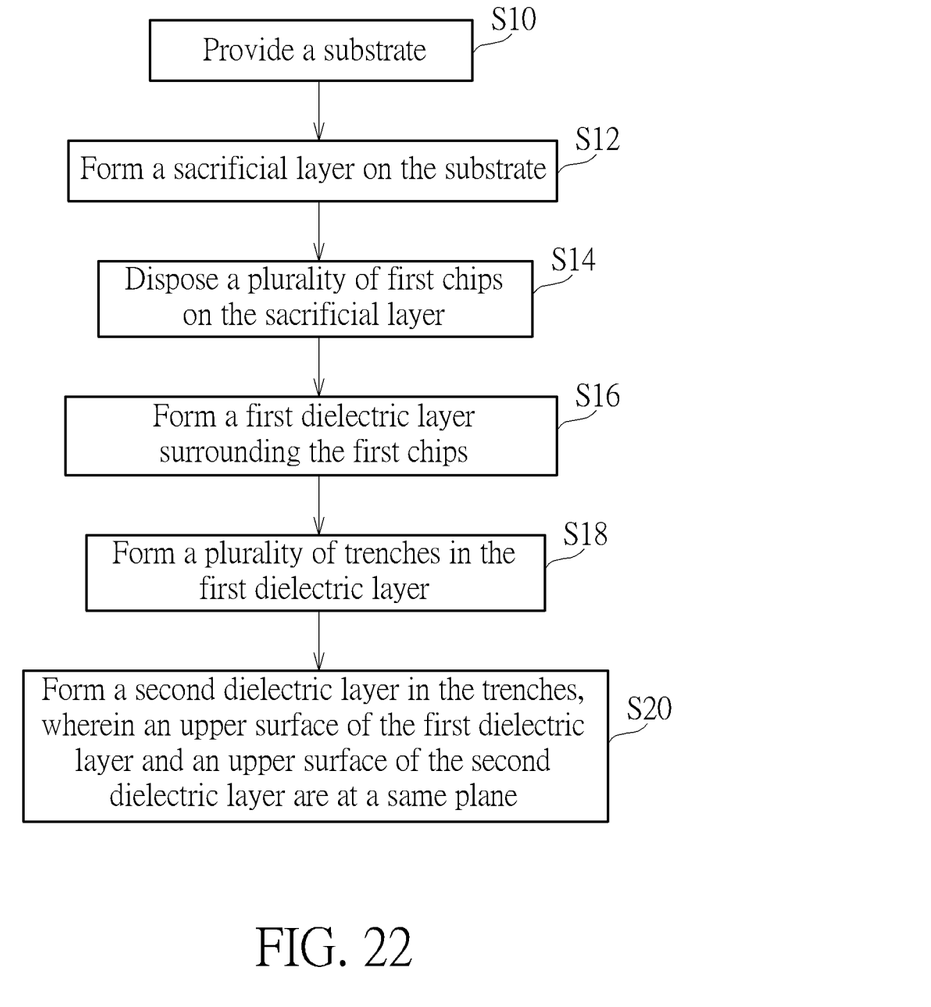
FIG. 22 is a schematic diagram of a process flow of a manufacturing method of semiconductor device according to the first embodiment of the present disclosure.

Referring to FIG. 22, FIG. 22 is a schematic diagram of process flow of a manufacturing method of semiconductor device according to the first embodiment of the present disclosure. As described above, the manufacturing method of semiconductor device according to the present disclosure may include the following steps:

Step S10: Provide a substrate.
Step S12: Form a sacrificial layer on the substrate.
Step S14: Dispose a plurality of first chips on the sacrificial layer.
Step S16: Form a first dielectric layer surrounding the first chips.
Step S18: Form a plurality of trenches in the first dielectric layer.
Step S20: Form a second dielectric layer in the trenches, wherein an upper surface of the first dielectric layer and an upper surface of the second dielectric layer are at a same plane. In other words, a distance from the upper surface of the first dielectric layer to a reference surface parallel to the upper surface of the first dielectric layer is substantially equal to a distance from the upper surface of the second dielectric layer to a reference surface parallel to the upper surface of the first dielectric layer.

The manufacturing method of the semiconductor device in the present disclosure may further includes forming a redistribution layer electrically connected to the first chips, and detaching the first chips from the sacrificial layer, wherein in the first embodiment, the redistribution layer is formed before the first chips are detached from the sacrificial layer.

The manufacturing method of semiconductor device in the present disclosure is not limited to the above mentioned embodiment. Further embodiments or variant embodiments of the present disclosure are described below. To simplify the description, the following description will detail the dissimilarities among different variant embodiments or embodiments, the identical components in each of the following embodiments are marked with identical symbols, and the identical features will not be redundantly described. Besides, the material and the thickness of each of the layers and the processing steps in the following embodiments may be referred to the first embodiment and will not be redundantly described.

Figure 7:
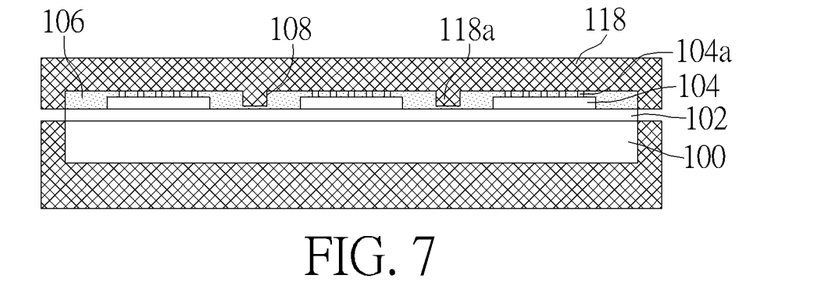
FIG. 7 is a schematic diagram illustrating fabrication process of a manufacturing method of semiconductor device according to a second embodiment of the present disclosure.

Referring to FIG. 7, FIG. 7 is a schematic diagram illustrating fabrication process of a manufacturing method of semiconductor device according to a second embodiment of the present disclosure. The difference between this embodiment and the first embodiment is that a mold is used for forming the first dielectric layer and the trenches in this embodiment. According to this embodiment, after disposing the first chips 104 on the sacrificial layer 102, a mold 118 may be further provided. The mold 118 includes a plurality of protruding portions 118a corresponding to the positions that are predetermined to form the trenches. Next, the substrate 100 and the first chips 104 on the substrate 100 are placed in the mold 118, and a dielectric material is injected into the mold 118 and is then solidified, such that a first dielectric layer 106 having a plurality of trenches 108 are formed. After forming the first dielectric layer 106 having the plurality of trenches 108, the mold 108 may be removed, and then the second dielectric layer 110, redistribution layer 112 and solder balls 114 may be formed. Similar to the first embodiment, the upper surfaces of the second dielectric layer 110 and the first dielectric layer 106 are substantially at a same plane, wherein the meaning of the above two are at the same plane means that a distance from the upper surface of the first dielectric layer 106 to a reference surface parallel to the upper surface of the first dielectric layer 106 is substantially equal to a distance from the upper surface of the second dielectric layer 110 to the reference surface parallel to the upper surface of the first dielectric layer 106, and will not be redundantly described. According to this embodiment, the method of using the mold 118 for directly forming the dielectric layer 106 having the trenches 108 may replace the three steps of forming the first dielectric layer 106, removing a portion of the first dielectric layer 106 and forming the trenches 108 in the first embodiment (as shown in FIG. 1 to FIG. 3). In addition, the mold 118 can be used for making the upper surface of the first dielectric layer 106 not higher than the bonding pads 104a of the first chip 104. Besides, in a variant embodiment of this embodiment, a first dielectric layer 106 with an approximately flat surface can be formed first, and an imprinting process can be performed to form the trenches 108 by using the mold 118 having the protruding portions 118a to.

Figure 23:
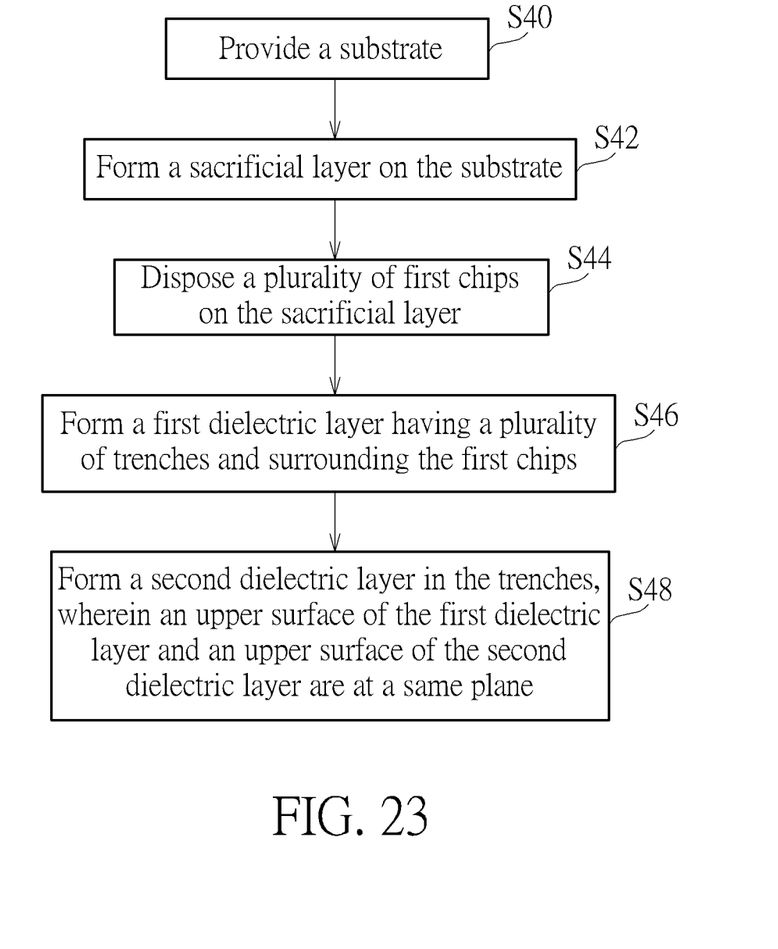
FIG. 23 is a schematic diagram of a process flow of a manufacturing method of semiconductor device according to the second embodiment of the present disclosure.

Referring to FIG. 23, FIG. 23 is a schematic diagram of process flow of a manufacturing method of semiconductor device according to the second embodiment of the present disclosure. As described above, the manufacturing method of semiconductor device of the present disclosure may include the following steps:

Step S40: Provide a substrate.
Step S42: Form a sacrificial layer on the substrate.
Step S44: Dispose a plurality of first chips on the sacrificial layer.
Step S46: Form a first dielectric layer having a plurality of trenches and surrounding the first chips.
Step S48: Form a second dielectric layer in the trenches, wherein an upper surface of the first dielectric layer and an upper surface of the second dielectric layer are at a same plane. The meaning of the above two are at the same plane means that a distance from the upper surface of the first dielectric layer to a reference surface parallel to the upper surface of the first dielectric layer is substantially equal to a distance from the upper surface of the second dielectric layer to the reference surface parallel to the upper surface of the first dielectric layer.

Figure 8:
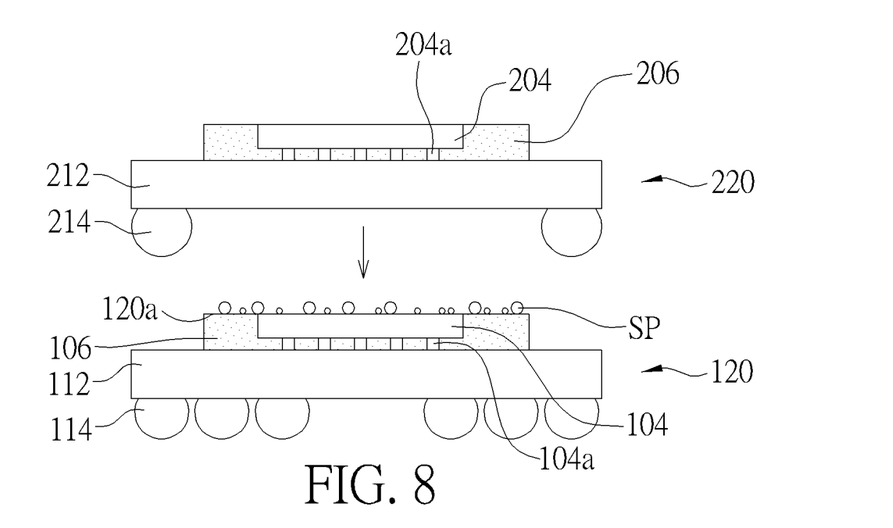
FIG. 8 to FIG. 9 are schematic diagrams illustrating fabrication process of a manufacturing method of semiconductor device according to a third embodiment of the present disclosure.
Figure 9:
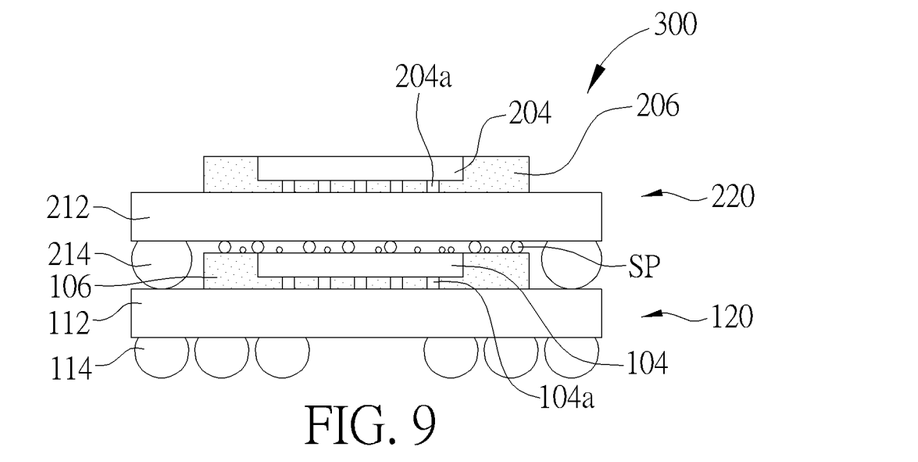

Refer to FIG. 8 to FIG. 9, FIG. 8 to FIG. 9 are schematic diagrams illustrating fabrication process of a manufacturing method of semiconductor device according to a third embodiment of the present disclosure. The third embodiment further describes the application of the present disclosure in a fabrication process of package on package (POP) structure. The third embodiment of the present disclosure may be subsequent to FIG. 5 of the first embodiment. After manufacturing the packaging structure 120, another packaging structure 220 is provided, wherein the packaging structure 220 includes a second chip 204 (with bonding pads 204a), a packaging material 206, a redistribution layer 212 and solder balls 214. The method of this embodiment includes disposing the packaging structure 220 on the packaging structure 120, that is, disposing the second chip 204 on one of the first chips 104 introduced in the previous embodiments, and disposing a plurality of spacer balls SP between the first chip 104 and the second chip 204. The spacer balls SP may include polymer material, such as the spacer material that can be used as the spacers of liquid-crystal cell in conventional liquid crystal display panel. As shown in FIG. 8, a plurality of spacer balls SP with various particle sizes (or diameters) and/or non-identical elastic coefficients may first be disposed on the first chip 104. The spacer balls SP may be disposed and fixed on the first chip 104, (i.e., on the upper surface 120a of the packaging structure 120e) through spraying, slit coating or printing process, but the method of disposing the spacer balls SP is not limited thereto. After that, as shown in FIG. 9, the packaging structure 220 is fixed on the packaging structure 120. For example, solder balls 214, conductive pads or bumps can be used to electrically connect the second chip 204 in the packaging structure 220 to the first chip 104 or some of the solder balls 114 in the packaging structure 120, so as to form a package on package structure 300.

Figure 10:
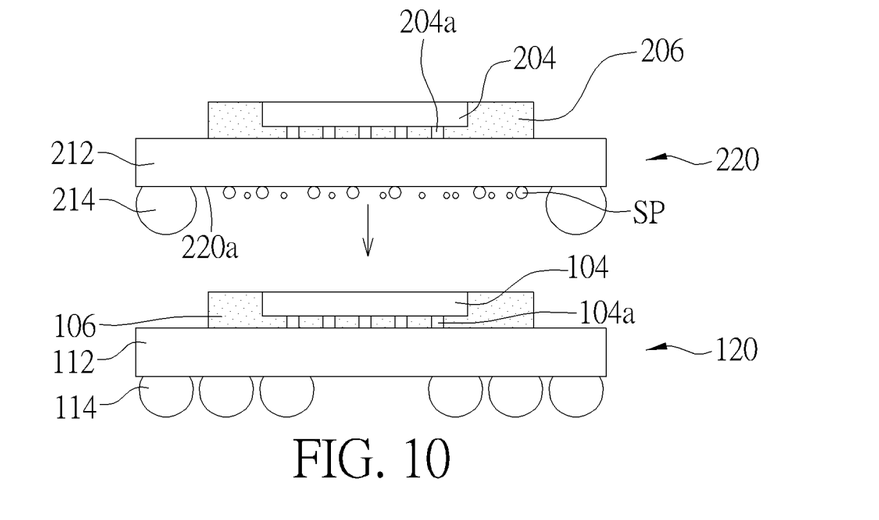
FIG. 10 is a schematic diagram illustrating fabrication process of a manufacturing method of semiconductor device according to a first variant embodiment of the third embodiment of the present disclosure.

Referring to FIG. 10, FIG. 10 is a schematic diagram illustrating fabrication process of a manufacturing method of semiconductor device according to a first variant embodiment of the third embodiment of the present disclosure. The difference between this variant embodiment and the third embodiment is that the spacer balls SP having various particle sizes (or diameters) and/or non-identical elastic coefficients are fixed at a lower surface 220a of the packaging structure 220 (e.g., the lower surface of the redistribution layer 212) before the packaging structure 220 is fixed on the packaging structure 120 in this variant embodiment.

The third embodiment and its variant embodiment in the present disclosure disclose a manufacturing method of package on package structure including a semiconductor device. Spacer balls SP having various particle sizes (or diameters) and/or non-identical elastic coefficients are used as supporters between different packaging structures. The design of the elastic characteristic and various particle sizes of the spacer balls SP provide buffer functionality of stress and thickness, such that warpage issue may be mitigated. Compared to methods of filling a layer of glue between different packaging structures by spreading or pasting, the design of the spacer balls SP in the present disclosure further provides an advantage of better heat dissipation.

Figure 11:
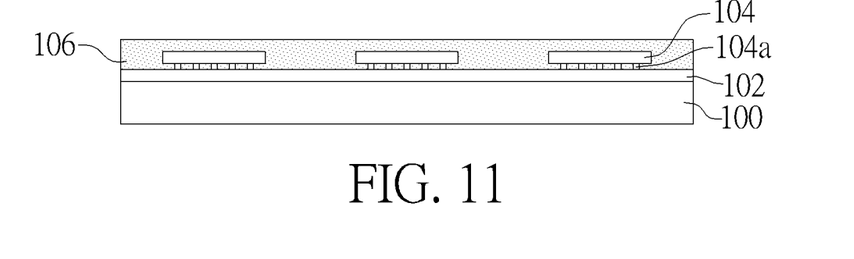
FIG. 11 to FIG. 13 are schematic diagrams illustrating fabrication process of a manufacturing method of semiconductor device according to a fourth embodiment of the present disclosure.
Figure 12:
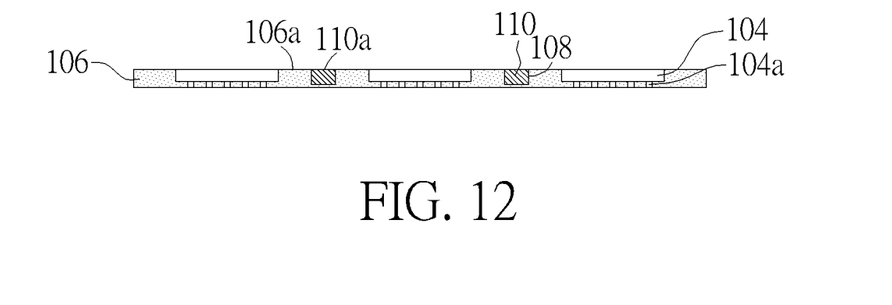
Figure 13:
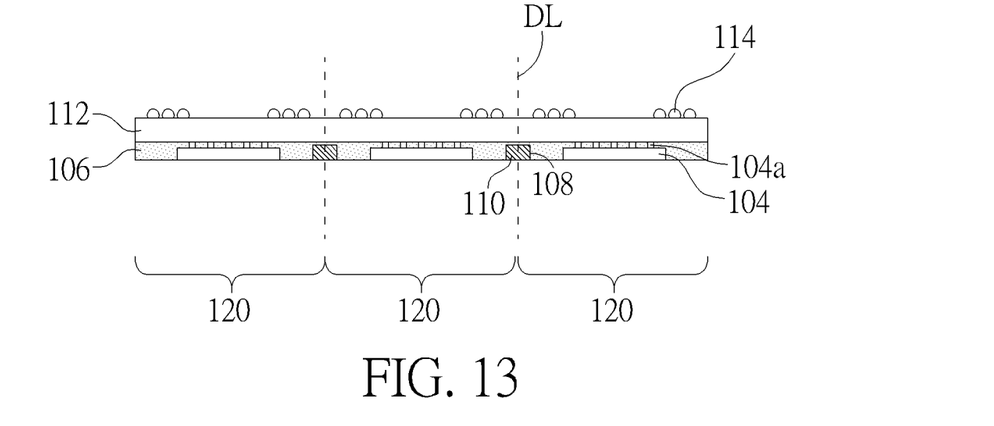

Referring to FIG. 11 to FIG. 13, FIG. 11 to FIG. 13 are schematic diagrams illustrating fabrication process of a manufacturing method of semiconductor device according to a fourth embodiment of the present disclosure. The main difference between this embodiment and the first embodiment is the disposition method of the first chips 104. As shown in FIG. 11, when disposing the first chips 104 after the sacrificial layer 102 is manufactured on the substrate 100, the first chips 104 are disposed on the sacrificial layer 102 with the bonding pads 104a facing downward. That is, the bonding pads 104a are in contact with the surface of the sacrificial layer 102 directly, thus the package structure may be considered as face-down type of packaging structure. And then, a first dielectric layer 106 is formed to surround the first chips 104.

Referring to FIG. 12, a portion of the first dielectric layer 106 is removed, such that an upper surface 106a of the first dielectric layer 106 and upper surfaces of the first chips 104 are generally at a same plane. Then, similar to the first embodiment, a plurality of trenches 108 are formed in the first dielectric layer 106, and a second dielectric layer 110 is sequentially formed in the trenches 108, wherein an upper surface 110a of the second dielectric layer 110 and an upper surface 106a of the first dielectric layer 106 are substantially at a same plane. The meaning of the above two are at the same plane means that a distance from the upper surface 106a of the first dielectric layer 106 to a reference surface parallel to the upper surface 106a of the first dielectric layer 106 is substantially (or nominally) equal to a distance from the upper surface 110a of the second dielectric layer 110 to a reference surface parallel to the upper surface 106a of the first dielectric layer 106. After that, the first chip 104 is separated from the sacrificial layer 102 and the substrate 100, and the bonding pads 104a of each of the first chips 104 are exposed. In a variant embodiment, as the second embodiment described above, a mold 118 may be used for forming the first dielectric layer 104 and the trenches 108.

Referring to FIG. 13, after separating the first chips 104 from the sacrificial layer 102 and the substrate 100, a redistribution layer 112 is formed on a side of the first chip 104 having the bonding pads 104a. The conducting wires in the redistribution layer 112 can be electrically connected to the circuit in the first chip 104 through the bonding pads 104a. Next, a plurality of solder balls 114 are formed on the surface of the redistribution layer 112. The plurality of solder balls 114 are electrically connected to corresponding first chips 104. Then, a cutting process is performed along the cutting lines DL, so as to finish the manufacturing of the packaging structure 120. The arrangement of disposing the first chips 104 toward a different direction in this embodiment may also be applied to other embodiments or variant embodiments of the present disclosure, which will not be redundantly described. It is noted that, since the first chips 104 are disposed on the substrate 100 by way of making the bonding pads 104a face the sacrificial layer 102 in this embodiment, the first chips 104 are separated from the sacrificial layer 102 before forming the redistribution layer 112 on the surface of the exposed bonding pads 104a. From the above, the process flow of the manufacturing method of semiconductor device of this embodiment may refer to FIG. 22, and will not be redundantly described.

Figure 14:
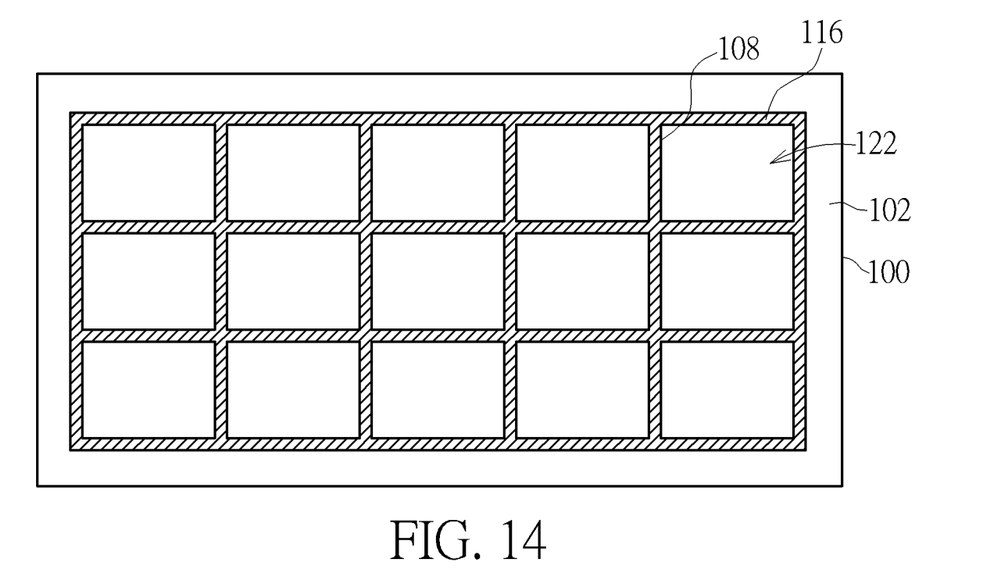
FIG. 14 to FIG. 17 are schematic diagrams illustrating fabrication process of a manufacturing method of semiconductor device according to a fifth embodiment of the present disclosure.
Figure 15:
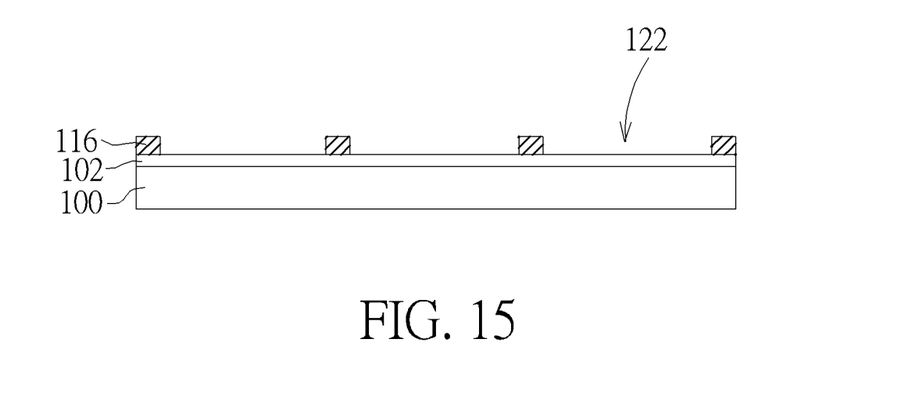
Figure 16:
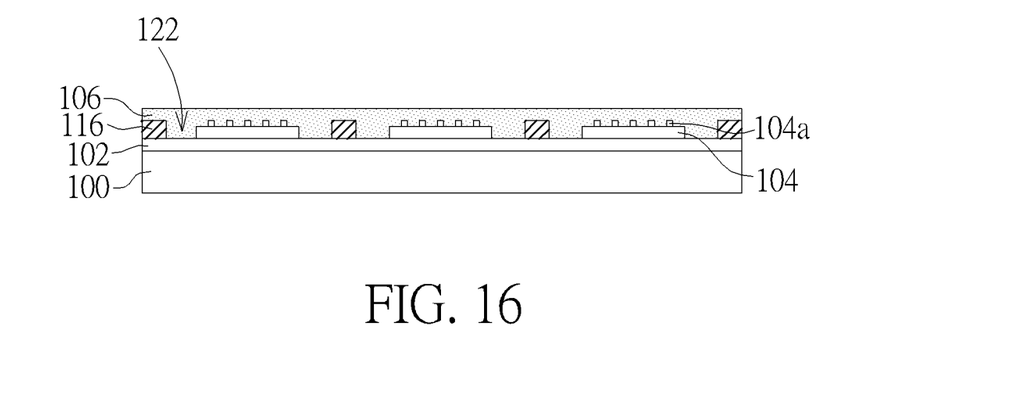

Referring to FIG. 14 to FIG. 17, FIG. 14 to FIG. 17 are schematic diagrams illustrating fabrication process of a manufacturing method of semiconductor device according to a fifth embodiment of the present disclosure. Referring to FIG. 14 and FIG. 15, FIG. 14 is a top-view schematic diagram, and FIG. 15 is a partial enlargement of sectional schematic diagram corresponding to FIG. 14. According to this embodiment, a substrate 100 is first provided, a sacrificial layer 102 is then formed on the substrate 100, and a patterned resin layer 116 is formed on the sacrificial layer 102, wherein the resin layer 116 includes a grid pattern which has a plurality of cavities 122 on the sacrificial layer 102. And then, as shown in FIG. 16, a plurality of first chips 104 are disposed in the cavities 122. For instance, each of the first chips 104 is respectively disposed in one of the cavities 122. In this embodiment, the first chips 104 are disposed by making the bonding pads 104a face up as an example. In variant embodiments, the first chips 104 may also be disposed with the bonding pads 104a facing down. After disposing the first chips 104, a dielectric material (that is, the material of a first dielectric layer 106 introduced in FIG. 17) is filled into the cavities 122.

Figure 17:
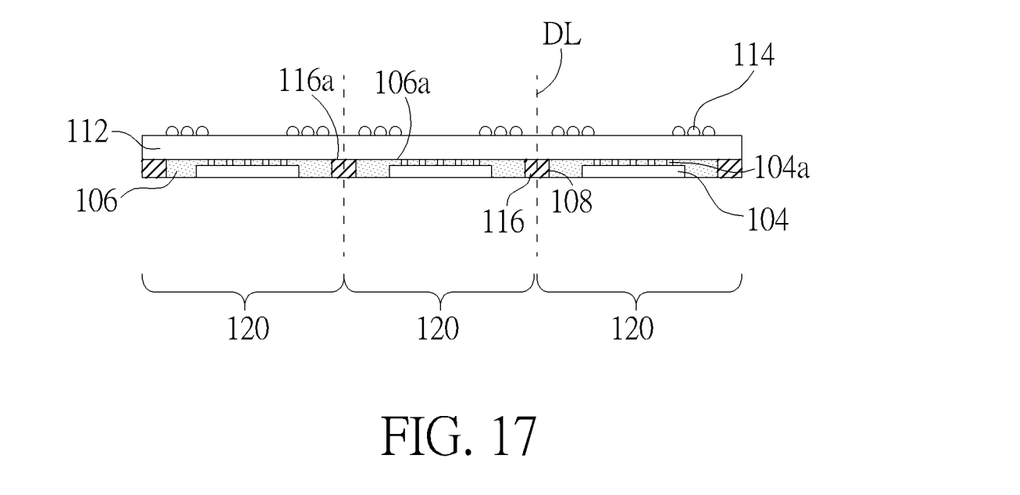

Referring to FIG. 17, next, the aforementioned dielectric material at the outside of the cavities 122 is removed. An upper surface 106a of the remained dielectric material (i.e., the first dielectric layer 106) and an upper surface 116a of the resin layer 116 are substantially at a same level, which means the upper surface 106a of the first dielectric layer 106 and the upper surface 116a of the resin layer 116 are substantially at the same plane or coplanar. The meaning of the above two are at the same plane is that a distance from the upper surface 106a of the first dielectric layer 106 to a reference surface parallel to the upper surface 106a of the first dielectric layer 106 is substantially equal to a distance from the upper surface 116a of the resin layer 116 to the reference surface parallel to the upper surface 106a of the first dielectric layer 106. Since the resin layer 116 is disposed in the first dielectric layer 106, it can be considered as that the first dielectric layer 106 have a plurality of trenches 108. Then, a redistribution layer 112 and solder balls 114 are formed on the first dielectric layer 106 in this embodiment, and the first chips 104 are detached from the sacrificial layer 102 and the substrate 100, wherein the solder balls 114 are electrically connected to corresponding first chips 104 through the redistribution layer 112, and the redistribution layer 112 is manufactured before the first chips 104 are detached from the sacrificial layer 102 and the substrate 100 in this embodiment. In variant embodiments, in the case of the bonding pads 104a of the first chips 104 are covered by the sacrificial layer 102, the first chips 104 may be detached from the sacrificial layer and the substrate 100 first to expose the bonding pads 104a, before manufacturing the redistribution layer 112. After the redistribution layer 112 and the solder balls 114 are manufactured, a cutting process may be performed along the cutting lines DL, so as to obtain a packaging structure 120.

Figure 24:
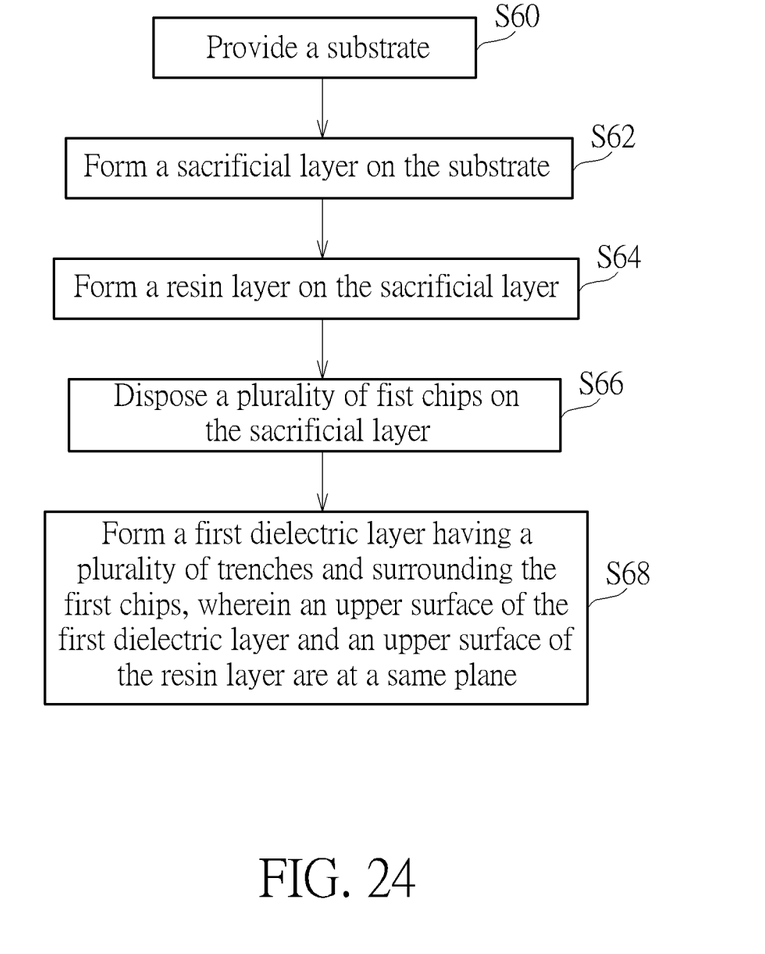
FIG. 24 is a schematic diagram of a process flow of a manufacturing method of semiconductor device according to the fifth embodiment of the present disclosure.

Referring to FIG. 24, FIG. 24 is a schematic diagram of a process flow of a manufacturing method of semiconductor device according to a fifth embodiment of the present disclosure. As described above, the manufacturing method of semiconductor device according to the fifth embodiment of the present disclosure includes the follow steps:

Step S60: Provide a substrate.
Step S62: Form a sacrificial layer on the substrate.
Step S64: Form a resin layer on the sacrificial layer.
Step S66: Dispose a plurality of first chips on the sacrificial layer.
Step S68: Form a first dielectric layer having a plurality of trenches and surrounding the first chips, wherein an upper surface of the first dielectric layer and an upper surface of the resin layer are at a same plane, wherein the meaning of the above two are at the same plane is that a distance from the upper surface of the first dielectric layer to a reference surface parallel to the upper surface of the first dielectric layer is substantially (or nominally) equal to a distance from the upper surface of the resin layer to the reference surface parallel to the upper surface of the first dielectric layer 106.

Figure 18:
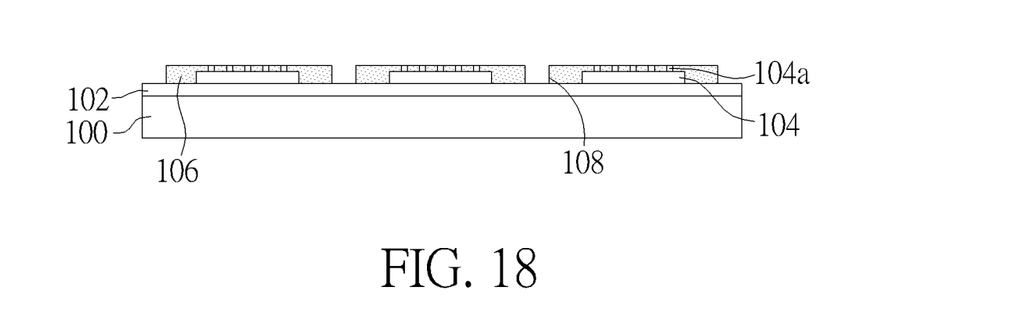
FIG. 18 to FIG. 20 are schematic diagrams illustrating fabrication process of a manufacturing method of semiconductor device according to a sixth embodiment of the present disclosure.
Figure 19:
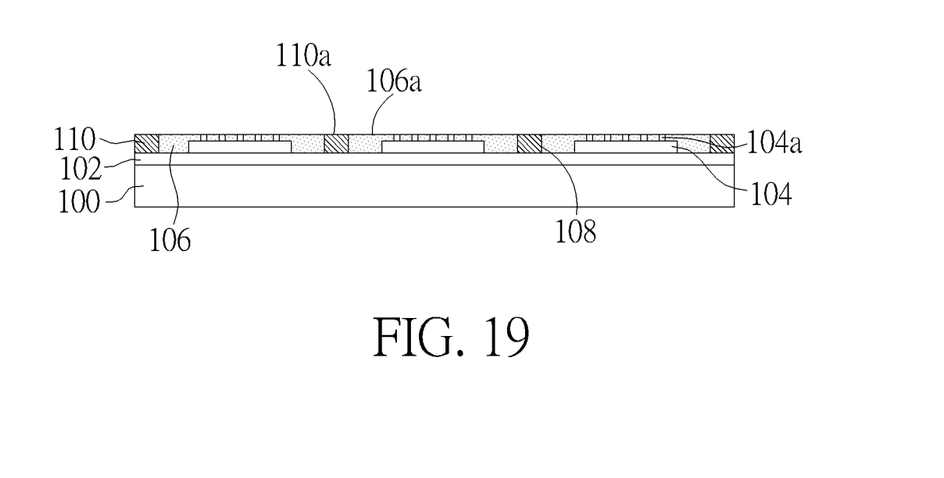
Figure 20:
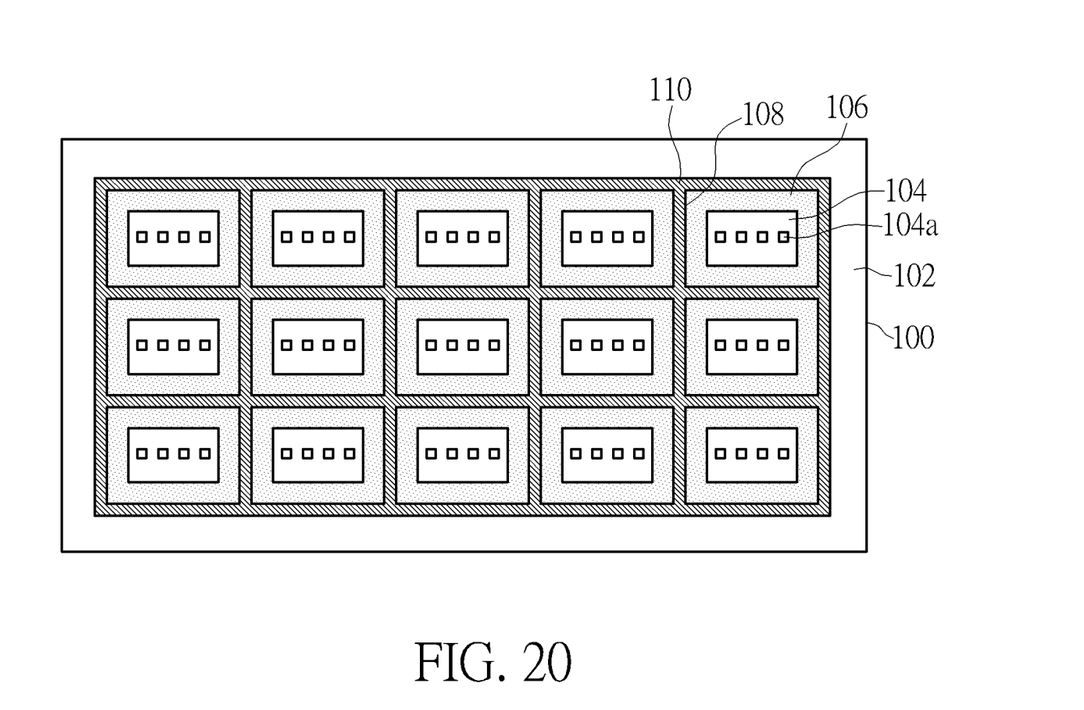

Referring to FIG. 18 to FIG. 20, FIG. 18 to FIG. 20 are schematic diagrams illustrating fabrication process of a manufacturing method of semiconductor device according to a sixth embodiment of the present disclosure, wherein FIG. 18 is subsequent to the process of FIG. 16 of the fifth embodiment. The main difference between this embodiment and the fifth embodiment is that the resin layer 116 will be removed in the fabrication process of this embodiment. As shown in FIG. 16 and FIG. 18, according to this embodiment, after the first chips 104 are disposed in the cavities 122 of the resin layer 116 and the first dielectric layer 106 is filled into the cavities 122, a portion of the first dielectric layer 106 is removed, such that an upper surface of the first dielectric layer 106 and an upper surface of the resin layer 116 are substantially coplanar (at a same plane), wherein the meaning of the above two are coplanar or at the same plane is that a distance from the upper surface of the first dielectric layer 106 to a reference surface parallel to the upper surface 106a of the first dielectric layer 106 is substantially (or nominally) equal to a distance from the upper surface of the resin layer 116 to a reference surface parallel to the upper surface of the first dielectric layer 106 are substantially equal. And then, at least a portion of the resin layer 116 is removed to form trenches 108 in the first dielectric layer 106. This embodiment takes the resin layer 116 being entirely removed as an example, but the resin layer 116 can be only partially removed in some other embodiments.

Next, as shown in FIG. 19, similar to the method shown in FIG. 2 to FIG. 3 in the first embodiment, a second dielectric layer 110 is formed in the trenches 108, and an upper surface 110a of the second dielectric layer 110 and an upper surface 106a of the first dielectric layer 106 are at a same plane, wherein the meaning of the above two are at the same plane is that a distance from the upper surface 106a of the first dielectric layer 106 to a reference surface parallel to the upper surface 106a of the first dielectric layer 106 is substantially (or nominally) equal to a distance from the upper surface 110a of the second dielectric layer 110 to a reference layer parallel to the upper surface 106a of the first dielectric layer 106 are substantially equal. FIG. 20 shows the top-view of the formed second dielectric layer 110, which has a grid pattern similar to the resin layer 116 shown in FIG. 14. Then, a redistribution layer 112 and solder balls 114 are manufactured, the first chips 104 are separated from the sacrificial layer 102 and the substrate 100, and a cutting process is performed to form a packaging structure of a semiconductor device, these fabrication processes will not be redundantly described. The process flow of the manufacturing method of semiconductor device of this embodiment may refer to FIG. 23, and will not be redundantly described.

Figure 21:
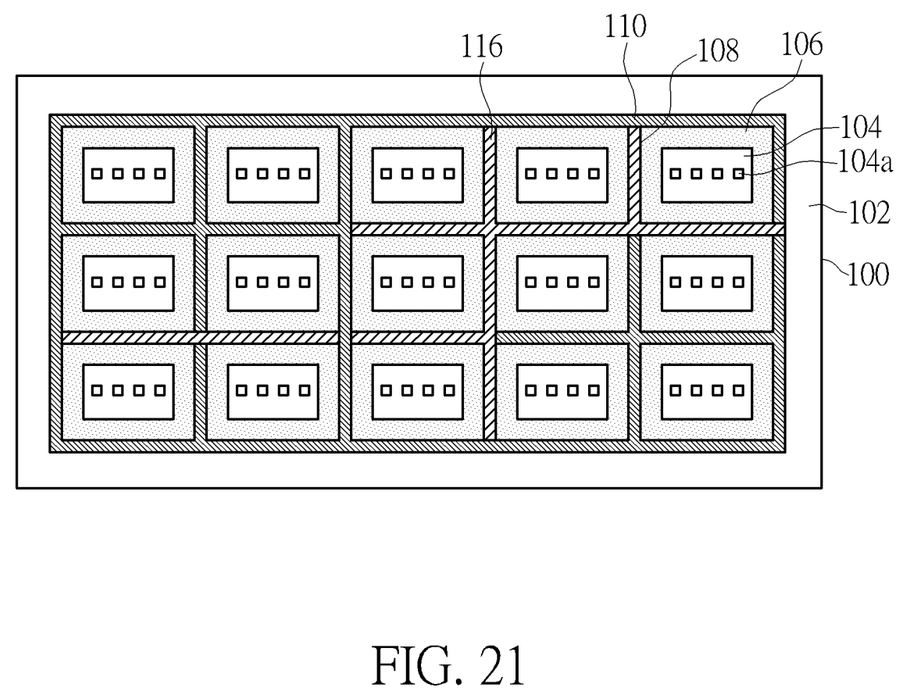
FIG. 21 is a top-view schematic diagram of a manufacturing method of semiconductor device according to a variant embodiment of the sixth embodiment of the present disclosure.

Referring to FIG. 21, FIG. 21 is a top-view schematic diagram of a manufacturing method of semiconductor device according to a variant embodiment of the sixth embodiment of the present disclosure. The difference between this variant embodiment and the sixth embodiment is that only a portion of the resin layer 116 is removed and another portion of the resin layer 116 is remained and then the second dielectric layer 110 is filled into the trenches 108 formed from removing the resin layer 116 in this variant embodiment. In other words, it can be considered as that the second dielectric layer 110 is disposed in some of the trenches 108 of the first dielectric layer 106, and the resin layer 116 is disposed in some other trenches 108 of the first dielectric layer 106. Hence, the first dielectric layer 106, the second dielectric layer 110 and the resin layer 116 coexist from the top view of the packaging structure of this variant embodiment. When these three material layers respectively include different materials having different CTEs, the patterns or locations of the first dielectric layer 106, the second dielectric layer 110 and the resin layer 116 may be designed according to the requirement of products, such that the stress distribution of the packaging structure can be adjusted and therefore warpage problem can be mitigated. The process flow of the manufacturing method of semiconductor device of this embodiment may refer to FIG. 23, which will not be redundantly described.

The manufacturing method of semiconductor device of the present disclosure may be applied to chip-first process, wherein trenches and trench-filling material (the aforementioned second dielectric layer or resin layer) are disposed in the main packaging material (the aforementioned first dielectric layer). For the semiconductor device manufactured according to the present disclosure, discontinuous or different packaging materials are formed on the surface of the chips, such as including two of the first dielectric layer, trenches, the second dielectric layer and the resin layer, thus the stress distribution of the dielectric layer in the packaging structure may be adjusted, such as making the stress in the dielectric layer discontinuous. Furthermore, according to the present disclosure, the stress distribution of the packaging structure may also be adjusted through adopting dielectric layers with different materials. In another aspect, in the application of package on package structure, spacer balls with different particle sizes and elastic coefficients are introduced for serving as the supporters between different chips or packaging structures, which can provide better heat dissipation and may also relieve stress problems. Therefore, warpage problems in semiconductor devices can be mitigated according to the manufacturing method of semiconductor device of the present disclosure.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of a semiconductor device, comprising:
   providing a substrate;
   forming a sacrificial layer on the substrate;
   disposing first chips on the sacrificial layer;
   forming a first dielectric layer surrounding the first chips;
   forming trenches in the first dielectric layer;
   forming a second dielectric layer in the trenches; and
   forming a redistribution layer electrically connected to the first chips after forming the second dielectric layer in the trenches,
   wherein an upper surface of the first dielectric layer and an upper surface of the second dielectric layer are at a same plane,
   wherein the trenches penetrate the first dielectric layer and the sacrificial layer.

2. The manufacturing method of the semiconductor device according to claim 1, further comprising a step of detaching the first chips from the sacrificial layer.

3. The manufacturing method of the semiconductor device according to claim 2, wherein the step of forming the redistribution layer electrically connected to the first chips is performed before the step of detaching the first chips from the sacrificial layer.

4. The manufacturing method of the semiconductor device according to claim 2, wherein the step of forming the redistribution layer electrically connected to the first chips is performed after the step of detaching the first chips from the sacrificial layer.

5. The manufacturing method of the semiconductor device according to claim 2, further comprising forming solder balls on the redistribution layer, each of the solder balls being electrically connected to one of the first chips.

6. The manufacturing method of the semiconductor device according to claim 1, wherein the first dielectric layer has a first thickness, the second dielectric layer has a second thickness, and a ratio of the second thickness to the first thickness is in a range from 0.5 to 1.5.

7. The manufacturing method of the semiconductor device according to claim 1, wherein a coefficient of thermal expansion of the first dielectric layer is different from a coefficient of thermal expansion of the second dielectric layer.

8. The manufacturing method of the semiconductor device according to claim 1, further comprising disposing a second chip on one of the first chips, wherein spacer balls are disposed between the second chip and the one of the first chips.

9. The manufacturing method of the semiconductor device according to claim 8, wherein the spacer balls are disposed on the one of the first chips by spraying process, slit coating process or printing process, and the spacer balls have non-identical particle sizes.

* * * * *